(12) United States Patent
Kurtz et al.

(10) Patent No.: US 6,252,287 B1
(45) Date of Patent: Jun. 26, 2001

(54) INGAASN/GAAS HETEROJUNCTION FOR MULTI-JUNCTION SOLAR CELLS

(75) Inventors: Steven R. Kurtz; Andrew A. Allerman; John F. Klem, all of Albuquerque; Eric D. Jones, Edgewood, all of NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/314,778

(22) Filed: May 19, 1999

(51) Int. Cl.$^7$ .................................................. H01L 31/06
(52) U.S. Cl. .......................... 257/461; 257/431; 136/252
(58) Field of Search .................................. 257/431, 461; 136/252

(56) References Cited

U.S. PATENT DOCUMENTS

| | | | |
|---|---|---|---|
| 5,383,211 | 1/1995 | Van de Walle | 372/43 |
| 5,438,584 | 8/1995 | Paoli | 372/45 |
| 5,689,123 | 11/1997 | Major | 257/190 |
| 5,710,439 | * 1/1998 | Ohkubo | 257/85 |
| 5,719,894 | 2/1998 | Jewell | 372/45 |
| 5,719,895 | 2/1998 | Jewell | 372/45 |
| 5,756,375 | 5/1998 | Celii | 438/94 |
| 5,825,796 | 10/1998 | Jewell | 372/45 |
| 5,877,038 | 3/1999 | Coldren | 438/39 |
| 5,888,840 | 3/1999 | Kudo | 438/31 |

OTHER PUBLICATIONS

Freidman et al. "1–eV GaInNAs solar cells for ultrahigh–efficiency multijunction devices" 2nd World Conference and Exhibition on Phtovoltaic Solar Energy, Vienna, Jul. 10, 1998.*

Kurtz et al. "InGaAsN solar cells with 1.0 eV band gap, Lattice matched to GaAs" Applied Phys Lett. V74, 729–731, Feb. 1, 1999.*
Sato et al. "Metalorganic chemical vapor deposition of GaINAs lattice matched to GaAs for long–wavelength laser diodes" J. Crystal Growth, V192, 381–385, 1982.*
U.S. application No. 08/978,658, Hou, filed Nov. 26, 1997.
K. A. Bertness et al., "29.5%–Efficient GaInP/GaAs Tandem Solar Cells," *Applied Physics Letters*, vol. 65, pp. 989–991, Aug. 22, 1994.
P. K. Chiang et al., "Experimental Results of GaInP$_2$/GaAs/Ge Triple Junction Cell Development for Space Power Systems," *Proceedings of the 25th IEEE Photovoltaic Specialists Conference*, pp. 183–186, May 1996.
M. Kondow et al., "GaInNAs: A Novel Material for Long–Wavelength–Range Laser Diodes with Excellent High–Temperature Performance," *Japanese Journal of Applied Physics*, vol. 35, pp. 1273–1275, Feb. 1996.

(List continued on next page.)

*Primary Examiner*—Olik Chaudhuri
*Assistant Examiner*—Douglas A. Wille
(74) *Attorney, Agent, or Firm*—John P. Hohimer

(57) ABSTRACT

An InGaAsN/GaAs semiconductor p-n heterojunction is disclosed for use in forming a 0.95–1.2 eV bandgap photodetector with application for use in high-efficiency multijunction solar cells. The InGaAsN/GaAs p-n heterojunction is formed by epitaxially growing on a gallium arsenide (GaAs) or germanium (Ge) substrate an n-type indium gallium arsenide nitride (InGaAsN) layer having a semiconductor alloy composition $In_xGa_{1-x}As_{1-y}N_y$ with $0<x\leq0.2$ and $0<y\leq0.04$ and a p-type GaAs layer, with the InGaAsN and GaAs layers being lattice-matched to the substrate. The InGaAsN/GaAs p-n heterojunction can be epitaxially grown by either molecular beam epitaxy (MBE) or metalorganic chemical vapor deposition (MOCVD). The InGaAsN/GaAs p-n heterojunction provides a high open-circuit voltage of up to 0.62 volts and an internal quantum efficiency of >70%.

24 Claims, 5 Drawing Sheets

OTHER PUBLICATIONS

M. Meyer et al., "Flying High: The Commercial Satellite Industry Converts to Compound Semiconductor Solar Cells," Compound Semiconductor, pp. 22–24, Nov./Dec. 1996.

S. Sato et al., "Room–Temperature Operation of GaInNAs/ GaInP Double–Heterostructure Laser Diodes Grown by Metalorganic Chemical Vapor Deposition," *Japanese Journal of Applied Physics*, vol. 36, pp. 2671–2675, May 1997.

M. Kondow, T. Kitatani, S. Nakatsuka, M.C. Larson, K. Nakahara, Y. Yazawa, M. Okai and K. Uomi, "GaInNAs: A Novel Material for Long–Wavelength Semiconductor Laser," *IEEE Journal of Selected Topics in Quantum Electronics*, vol. 3, pp. 719–730, Jun. 1997.

S.R. Kurtz, D. Myers and J.M. Olson, "Projected Performance of Three– and Four–Junction Device Using GaAs and GaInP," Presented at the 26th Photovoltaic Specialists Conference, Anaheim, CA, Sep. 30–Oct. 3, 1997.

T. Miyamoto, K. Tateuchi, F. Koyama and K. Iga, "A Novel GaInNAs–GaAs Quantum–Well Structure for Long–Wavelength Semiconductor Lasers," *IEEE Photonics Technology Letters*, vol. 9, pp. 1448–1450, Nov. 1997.

T. Miyamoto, K. Takeuchi, T. Kageyama, F. Koyama and K. Iga, "GaInNAs/GaAs Quantum Well Growth by Chemical Beam Epitaxy," *Japan Journal of Applied Physics*, vol. 37, pp. 90–91, Jan. 1998.

S. Sato and S. Satoh, "Metalorganic Chemical Vapor Deposition of GaInNAs Lattice Matched to GaAs for Long–Wavelength Laser Diodes," *Journal of Crystal Growth*, vol. 192, pp. 381–385, 1998.

H.P. Xin and C.W. Tu, "GaInNAs/GaAs Multiple Quantum Wells Grown by Gas Source Molecular Beam Epitaxy," Applied Physics Letters, vol. 72, pp. 2442–2444, May 11, 1998.

D.J. Friedman, J.F. Geisz, S.R. Kurtz and J.M. Olson, "1–eV GaInNAs Solar Cells for Ultrahigh–Efficiency Multijunction Devices," Presented at the 2nd World Conference and Exhibition on Photovoltaic Solar Energy Conversion, Vienna, Austria, Jul. 6–10, 1998.

T. Prokofyeva, T. Sauncy, M. Seon, M. Holtz, Y. Qui, S. Nikishin and H. Temkin, "Raman Studies of Nitrogen Incorporation in GaAs$_{1-x}$N$_x$," *Applied Physics Letters*, vol. 73, pp. 1409–1411, Sep. 7, 1998.

S.R. Kurtz, A.A. Allerman, E.D. Jones, J.M. Gee, J.J. Banas and B.É. Hammons, "InGaAsN Solar Cells with 1.0 eV Band Gap, Lattice Matched to GaAs, " *Applied Physics Letters*, vol. 74, pp. 729–731, Feb. 1, 1999.

\* cited by examiner

US 6,252,287 B1

INGAASN/GAAS HETEROJUNCTION FOR MULTI-JUNCTION SOLAR CELLS

GOVERNMENT RIGHTS

This invention was made with Government support under Contract No. DE-AC 04-94AL85000 awarded by the U.S. Department of Energy. The Government has certain rights in the invention.

FIELD OF THE INVENTION

The present invention relates to multi-junction solar cells formed, at least in part, from III-V compound semiconductors, and in particular to a photodetector comprising an indium gallium arsenide nitride (InGaAsN)/gallium arsenide (GaAs) semiconductor p-n heterojunction which can be used for detecting light and for forming a high-efficiency multi-junction solar cell.

BACKGROUND OF THE INVENTION

Multi-junction solar cells based on III-V compound semiconductor p-n homojunctions have been proposed for the high-efficiency generation of electricity for space photovoltaic applications, and also for terrestrial high-concentration photovoltaic applications. A homojunction is formed by doping a layer of a single type of semiconductor material with n-type and p-type doped portions; whereas a heterojunction is formed from contacting layers of two different types of semiconductor materials, with the two types of semiconductor materials being oppositely doped.

For space photovoltaic applications, an increased solar cell efficiency is advantageous for increasing the available electrical power or alternately reducing satellite mass and launch cost. An increased solar cell efficiency also reduces the size required for a space photovoltaic array, thereby improving reliability by lessening he possibility for damage resulting from deployment or space debris.

Since the early 1960's, efforts have been made to improve the energy conversion efficiency of solar cells. These efforts lead to the development of multi-junction solar cells in the 1980's, and the development in 1994 of a two-junction InGaP/GaAs solar cell based on III-V compound semiconductors with an energy conversion efficiency of 29.5% for AM1.5 solar illumination at an angle of 45° above the horizon (see K. A. Bertness et al., "29.5% Efficient GaInP/GaAs Tandem Solar Cells," in *Applied Physics Letters*, vol. 65, pp. 989–991, 1994). In 1996, a three-junction InGaP/GaAs/Ge solar cell was disclosed with an AMO (space solar spectrum) energy conversion efficiency of 25.7% (see P. K. Chiang et al., "Experimental Results of GaInP$_2$/GaAs/Ge Triple Junction Cell Development for Space Power Systems," in *Proceedings of the 25th IEEE Photovoltaic Specialists Conference*, pp. 183–186,1996).

These previous multi-junction solar cells have been based on the use of semiconductor p-n homojunctions, with each homojunction being formed from a single semiconductor material (i.e. GaInP$_2$, GaAs or Ge) by selectively doping different portions or layers of that material p-type and n-type. For example, the above three-junction GaInP$_2$/GaAs/Ge solar cell comprises three p-n homojunctions (i.e. one p-n homojunction formed from each of three different semiconductor materials), with the three p-n homojunctions being series connected by intervening n-p tunnel junctions. The resulting structure is a monolithic, lattice-matched solar cell having three light-absorbing homojunctions with bandgap energies of 1.85 electron volts (eV) for the GaInP$_2$ homojunction, 1.42 eV for the GaAs homojunction, and 0.67 eV for the Ge homojunction.

The energy conversion efficiency of this 3-junction solar cell, although large, is limited by a relatively large 0.75 eV difference in the bandgap energy of the GaAs and Ge materials which results in a significant super-bandgap energy loss to the Ge homojunction in the form of heat. Additionally, the energy conversion efficiency of the three-junction solar cell is limited by a relatively low bandgap energy of the GaInP$_2$ homojunction which limits the number of solar photons that can reach the underlying GaAs homojunction, thereby limiting the electrical current that can be produced by the GaAs homojunction. Since each layer within the solar cell is connected in series, the electrical current limitation of the GaAs homojunction limits the overall solar cell electrical current that can be produced in response to solar illumination, thereby limiting an overall energy conversion efficiency of the device.

The need for solar cells with an even higher energy conversion efficiency has prompted the suggestion that yet another p-n homojunction should be added to the above two-junction and three-junction solar cells, with this additional p-n homojunction having a bandgap energy of about 1 eV, but otherwise with no specific identification of what type of semiconductor material could be used to provide the 1-eV homojunction (see S. R. Kurtz et al, "Projected Performance of Three- and Four-Junction Devices Using GaAs and GaInP," *Proceedings of the of the 26th Photovoltaic Specialists Conference*, Anaheim, Calif., Sep. 30–Oct. 3, 1997, pp. 875–878).

An advantage of the present invention is that an InGaAsN/GaAs semiconductor p-n heterojunction comprising a layer of indium gallium arsenide nitride (InGaAsN) with n-type doping epitaxially grown in contact with a layer of gallium arsenide (GaAs) with p-type doping is disclosed herein that can be used to form an efficient 0.95–1.2 eV bandgap photodetector for use in a multifunction solar cell.

Another advantage of the present invention is that the use of an InGaAsN/GaAs semiconductor p-n heterojunction having contacting layers of and p-type GaAs overcomes the limitation of a very low or negligible electron diffusion that occurs in homojunctions or heterojunctions formed in part from p-type InGaAsN.

A further advantage is that the InGaAsN/GaAs p-n heterojunction of the present invention, based on layers of n-type InGaAsN and p-type GaAs, provides a substantial increase in open-circuit voltage and short-circuit current as compared to homojunctions and heterojunctions formed in part from p-type InGaAsN.

These and other advantages of the method of the present invention will become evident to those skilled in the art.

SUMMARY OF THE INVENTION

The present invention relates to a semiconductor p-n heterojunction for use in forming a photodetector that has applications for use in a multi-junction solar cell or for detecting light at an energy greater than 0.95–1.2 eV (i.e. at wavelengths below 1–1.3 µm), and to methods for forming the semiconductor p-n heterojunction and the photodetector. The semiconductor p-n heterojunction of the present invention, which has applications for use in forming photodetectors and multi-junction solar cells, comprises a layer of indium gallium arsenide nitride (InGaAsN) with n-type doping that is epitaxially grown in contact with a layer of gallium arsenide (GaAs) with p-type doping. The InGaAsN and GaAs layers can be epitaxially grown on a semiconductor substrate such as GaAs or Ge (germanium), with the layers being substantially lattice matched to the substrate with minimal strain.

The n-type-doped InGaAsN layer has a semiconductor alloy composition $In_xGa_{1-x}As_{1-y}N_y$ with $0<x\leq0.2$ and $0<y\leq0.04$ to provide a bandgap energy that is preferably in the range of about 0.95–1.2 electron volts (eV). The n-type doping of the InGaAsN layer can be varied during epitaxial growth to provide a first portion of the InGaAsN layer with a low concentration of n-type dopant ions (e.g. $<10^{17}$ cm$^{-3}$), and a second portion of the InGaAsN layer with a higher concentration of n-type dopant ions (e.g. n-type doped to $10^{17}$–$10^{18}$ cm$^{-3}$). The n-type-doped InGaAsN layer has a layer thickness that is generally in the range of about 1 to 5 microns, and referably about 2–3 $\mu$m thick when used in a multi-junction solar cell.

The p-type doped GaAs layer, with a layer thickness of generally 0.1–3 icrons ($\mu$m), can be doped to about $10^{17}$–$10^{18}$ cm$^{-3}$ with Be, C, Zn, Cd, or Mg. On a p-type substrate, the p-type doped GaAs layer can be grown first, with the n-type InGaAsN layer being subsequently grown over the GaAs layer. On an n-type substrate, the order of the epitaxial growth can be reversed so that the p-type GaAs layer overlies the n-type InGaAsN layer.

The method for forming the InGaAsN/GaAs semiconductor p-n heterojunction comprises steps for providing a substrate; epitaxially growing on the substrate a p-type doped layer of GaAs; and epitaxially growing on the GaAs layer an n-type-doped layer of InGaAsN. As described above, the substrate can be either GaAs or Ge; and the epitaxial growth can be performed by either MBE or MOCVD. For MBE-growth, the n-type InGaAsN layer is preferably epitaxially grown at a low temperature of about 425 to 500° C. can be used, and preferably about 450° C. to provide a semiconductor alloy composition that is substantially lattice matched to the substrate, and with a bandgap energy that is preferably in the range of about 0.95–1.2 eV. If MOCVD growth is used, the n-type InGaAsN layer can be grown at a temperature in the range of 550 to 620° C., and preferably about 590–610° C. The n-type doping of the InGaAsN layer can include doping of different portions during epitaxial growth to provide different doping levels at different locations within the InGaAsN layer. Additionally, the n-type InGaAsN layer is preferably annealed at a temperature generally in the range of 650–700° C. to improve its electrical characteristics.

The InGaAsN/GaAs semiconductor p-n heterojunction of the present invention can be used in combination with semiconductor p-n homojunctions of conventional design (e.g. one or more homojunctions formed from InGaP, InGaAlP, GaAs or Ge) to form an efficient multi-junction solar cell. These combinations can be made during epitaxial growth by MBE or MOCVD, with the InGaAsN/GaAs p-n heterojunction of the present invention preferably being inserted below a GaAs homojunction, and separated from the GaAs homojunction by an n-p tunnel junction. Additional n-p tunnel junctions are preferably used to separate other adjacent pairs of junctions in the multi-junction solar cell so that the entire solar cell is series connected. The layer thicknesses of each homojunction or heterojunction in the multi-junction solar cell can be selected to provide a substantially equal short-circuit electrical current generation upon exposure to incident light, thereby optimizing the performance of the multi-junction solar cell.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
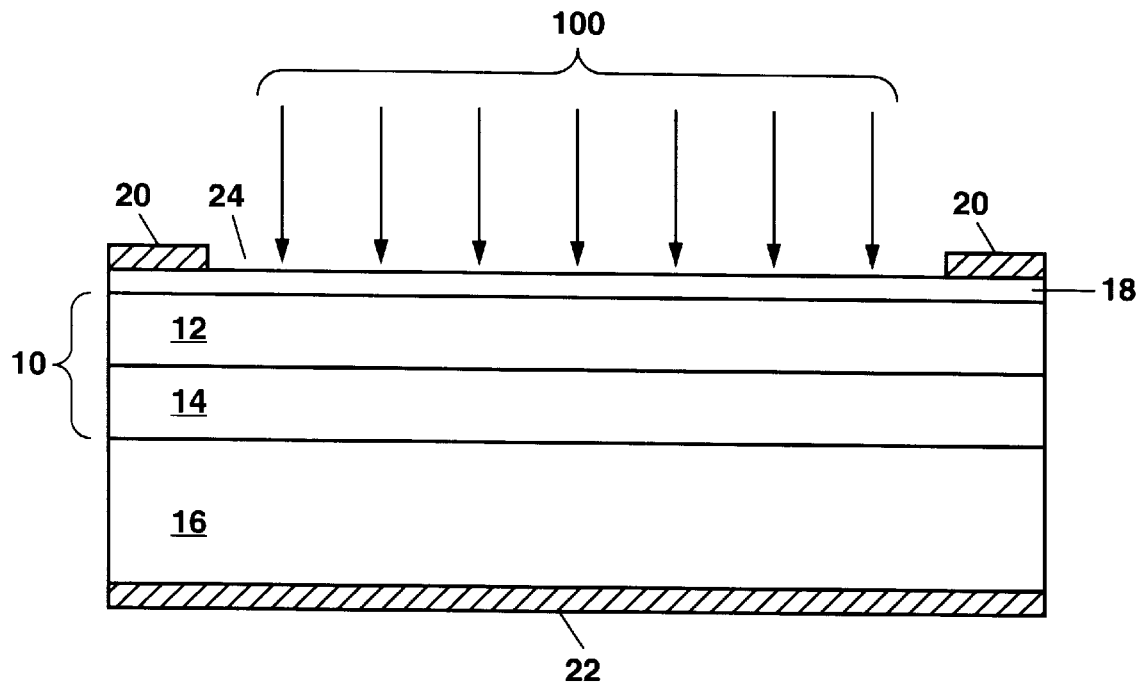
FIG. 1 shows a schematic cross-sectional view of the InGaAsN/GaAs semiconductor p-n heterojunction of the present invention epitaxially grown on a semiconductor substrate.

Referring to FIG. 1, there is shown a schematic cross-section view of an InGaAsN/GaAs semiconductor p-n heterojunction 10 of the present invention. The InGaAsN/GaAs heterojunction 10 comprises an n-type doped layer 12 of InGaAsN (indium gallium arsenide nitride) in contact with a p-type doped layer 14 of GaAs (gallium arsenide). The InGaAsN and GaAs layers, 12 and 14, are epitaxially grown above a substrate 16, with the exact ordering of the layers depending upon a doping type of the substrate 16. In the preferred case of a p-type doped substrate 16 as shown in FIG. 1, the p-type GaAs layer 14 is grown first, with the n-type InGaAsN layer 12 epitaxially grown over the GaAs layer 14. When an n-type substrate 16 is used, the order of growth of the GaAs layer 14 and the InGaAsN layer 12 is reversed.

In FIG. 1, the substrate 16 can comprise either GaAs or Ge, both of which have substantially identical lattice constants. As defined herein, the term "substrate" can include a buffer layer (e.g. 0.1–1 $\mu$m thick) epitaxially grown over a bulk semiconductor wafer to provide a smooth upper surface in preparation for epitaxial growth of subsequent semiconductor layers.

In the example of FIG. 1, a p-type doped GaAs layer 14 is epitaxially grown over a p-type substrate 16 to form a base layer for the InGaAsN/GaAs p-n heterojunction 10. The use of the p-type GaAs layer 14 in forming the heterojunction 10 provides an improved electron lifetime and electron diffusion as compared with p-type InGaAsN, thereby improving the performance of any solar cell comprising the InGaAsN/GaAs p-n heterojunction 10. Additionally, the use of the p-type GaAs layer 14 in forming the heterojunction 10 is advantageous in that a valence band offset between the p-type GaAs layer 14 and the n-type InGaAsN layer 12 is small, allowing holes generated in the n-type InGaAsN layer 12 to be swept across an electric-field region of the heterojunction 10 with substantially 100% efficiency (see energy band diagram in FIG. 2a). Finally, the p-type GaAs layer 14 is lattice-matched to the substrate 16. The term "lattice-matched" as used herein means that an epitaxially-grown semiconductor layer has a semiconductor alloy composition that is selected to provide a lattice constant $a_0$ averaged over the thickness of that layer which is substantially equal to the lattice constant of the substrate.

The epitaxial growth of the GaAs layer 14 can be performed by molecular beam epitaxy (MBE) at a growth temperature in the range of 580–600° C., and preferably 590° C. For MBE growth, the layer 14 can be p-type doped generally in the range of $10^{17}$–$10^{18}$ cm$^{-3}$ and preferably to about $10^{18}$ cm$^{-3}$, for example, by using beryllium (Be) as a p-type dopant. The p-type GaAs layer 14 will generally have a layer thickness in the range of 0.1–3 μm and can be, for example, about 0.3 μm thick.

For MBE growth of a subsequent n-type InGaAsN layer 12 as shown in FIG. 1 to form an emitter layer for the InGaAsN/GaAs p-n heterojunction 10, a growth temperature in the range of 425 to 500° C. can be used, and preferably about 450° C. The n-type InGaAsN layer 12 has a semiconductor alloy composition generally given by $In_xGa_{1-x}As_{1-y}N_y$, with $0<x\leq0.2$ and $0<y\leq0.04$. The exact composition will depend upon a predetermined bandgap energy for the layer 12 in the range of 0.95–1.2 eV, with $x\approx3y$ for a substantial lattice matching to the GaAs layer 14 and to the substrate 16. With InGaAsN, a higher bandgap energy can provide a higher open-circuit voltage, $V_{oc}$. As an example, the layer 12 can comprise the semiconductor alloy composition $In_{0.07}Ga_{0.93}As_{0.98}N_{0.02}$. X-ray diffraction can be used to evaluate the composition of the InGaAsN layer 12. The bandgap energy of the InGaAsN layer 12 can also be determined from a response curve for the InGaAsN/GaAs p-n heterojunction 10 as a function of the wavelength of incident light, or alternately from a measurement of an absorption or photoluminescence spectrum at a particular temperature.

The thickness of the n-type InGaAsN layer 12 is generally in the range of 1–5 μm, and preferably about 2–3 μm. The layer 12 can be divided into different portions having the same semiconductor alloy composition but different n-type doping levels. As an example, a relatively thick 2 μm first portion of the InGaAsN layer 12 can be epitaxially grown with a low n-type doping of $<10^{17}$ cm$^{-3}$, and a thinner 0.2 μm second portion of the layer 12 can be grown with a higher n-type doping in the range of $10^{17}$–$10^{18}$ cm$^{-3}$.

The first portion of the n-type InGaAsN layer 12 can be formed by lightly doping the InGaAsN during MBE growth using, for example, silicon (Si); and the second portion can be formed with a heavier n-type doping (e.g. $4\times10^{17}$ cm$^{-3}$). Alternately, the second portion can be n-type doped (e.g. to $\geq10^{17}$ cm$^{-3}$) and the first portion can be left undoped (i.e. not intentionally doped). A not-intentionally-doped first portion that is naturally p-type to $<10^{17}$ cm$^{-3}$ can be used in the InGaAsN/GaAs heterojunction 10 as long as the first portion is thinner than the sum of a width of the depletion region (i.e. the electric-field region) and the minority carrier (i.e. electron) diffusion length in the first portion.

An alternate method for epitaxially growing the p-type GaAs and n-type InGaAsN layers, 14 and 12, is by metalorganic chemical vapor deposition (MOCVD). In this case, the GaAs layer 14 can be grown at a temperature in the range of 600 to 750° C., and preferably at 600–650° C., using arsine (AsH$_3$) and trimethylgallium (TMGa) as source gases and hydrogen (H$_2$) as a carrier gas. Carbon tetrachloride (CCl$_4$), carbon tetrabromide (CBr$_4$) or disilane (Si$_2$H$_6$) can be used as source gases to provide carbon (C) for p-type doping of the GaAs layer 14. Alternate p-type dopant species include zinc (Zn), cadmium (Cd), magnesium (Mg) or beryllium (Be), generally provided during epitaxial growth as an entrained metalorganic source gas. The MOCVD growth can be performed using a conventional low-pressure MOCVD growth system with a low ambient pressure during growth of, for example, about 60 torr.

Growth of the n-type InGaAsN layer 12 can also be performed using MOCVD, with the growth temperature being generally in the range of 550 to 620° C., and preferably 590–610° C. To grow InGaAsN, trimethylindium (TMIn) and dimethylhydrazine (DMHy) are preferably used as additional source gases. The MOCVD growth of InGaAsN results in a layer that is p-type doped when no dopant species is introduced into the growth system. Therefore, when MOCVD growth of the layer 12 is used, an n-type dopant species must be intentionally introduced to dope the InGaAsN layer 12 n-type. This can be done using silicon tetrachloride (SiCl$_4$) or silicon tetrabromide (SiBr$_4$) to provide Si as the n-type dopant. Alternate n-type dopants for MOCVD include selenium (Se), sulphur (S), germanium (Ge) or tin (Sn) introduced into the MOCVD growth system in a gaseous form. The level of n-type doping can be varied during the MOCVD growth of the InGaAsN layer 12 to provide a stepped n-type dopant profile for forming the first and second portions of the layer 12 as described previously. The layer thicknesses, compositions and dopant levels for MOCVD generally follow those described previously for MBE growth of the InGaAsN/GaAs p-n heterojunction 10.

In the example of FIG. 1, to evaluate the performance of the InGaAsN/GaAs p-n heterojunction 10 a cap layer 18 can be epitaxially grown over the n-type InGaAsN layer 12 by MBE or MOCVD. The cap layer 18 can comprise, for example, a 150-nanometer-thick layer of GaAs that is n-type doped to $2\times10^{18}$ cm$^{-3}$ or more to facilitate the formation of an upper electrical contact 20 to the device.

Before formation of the upper contact 20 and a lower contact 22 on a bottom surface of the substrate 16, the InGaAsN layer 12 is preferably thermally annealed to improve its electrical characteristics, and in particular its hole mobility. This annealing step can be performed at a temperature in the range of 650–700° C., for a time period from about one-half hour at 650° C. to only a few minutes (e.g. 2–15 minutes) at a temperature of 700° C. The annealing step can be performed in a rapid thermal annealer with a nitrogen gas (N$_2$) ambient.

The annealing step is important for increasing a minority carrier diffusion length, L, for holes in the n-type InGaAsN layer 12. Before annealing, the minority carrier (i.e. hole) diffusion length, L, is typically 0.2–0.3 μm. After annealing, the minority carrier diffusion length increases to about 0.6–0.8 μm. To date, the only viable minority carrier diffusion in InGaAsN has been for holes in n-type doped InGaAsN after the above annealing step. The minority carrier diffusion for electrons in p-type InGaAsN is minimal, being only about 0.1 µm, with no substantial improvement upon annealing. This poor performance for p-type InGaAsN makes such material disadvantageous in an InGaAsN homojunction for use in a multi-junction solar cell. The poor performance of p-type InGaAsN can be overcome by forming a InGaAsN/GaAs p-n heterojunction 10 with a p-type GaAs layer 14 being substituted for the p-type InGaAsN in the InGaAsN homojunction.

Figure 2A:
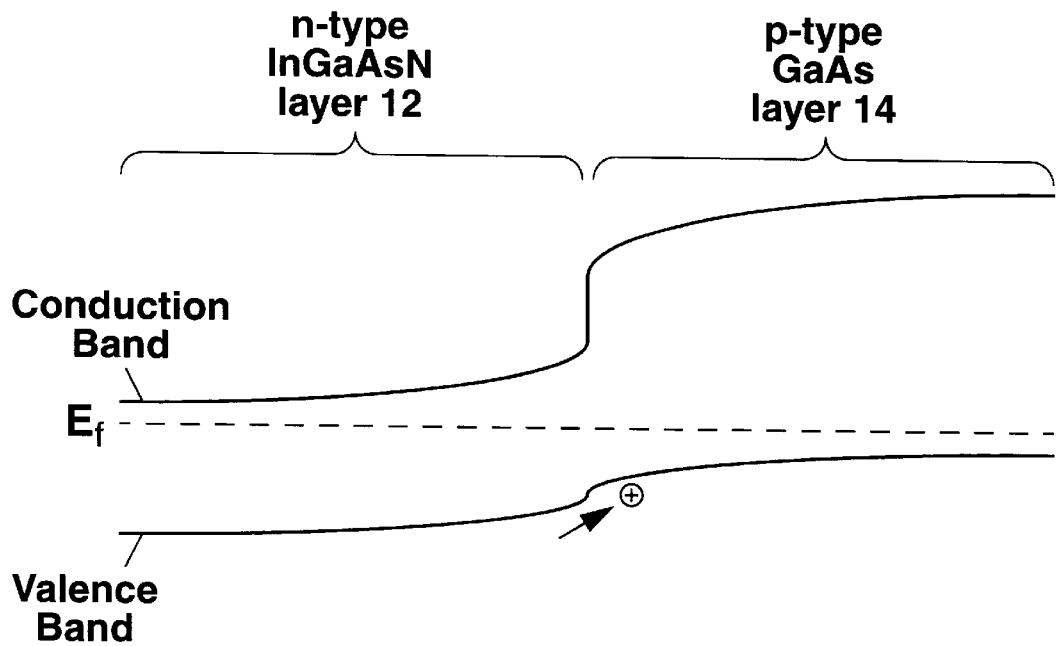
FIG. 2a shows an energy band diagram for the lnGaAsN/GaAs semiconductor p-n heterojunction of the present invention with a small valence band offset which allows hole transport across the p-n heterojunction with a substantially 100% heoretical quantum efficiency.

The use of p-type GaAs in forming the InGaAsN/GaAs p-n heterojunction 10 is made possible by a fortuitous band alignment of InGaAsN and GaAs as shown chemically in FIG. 2a. As shown in FIG. 2a, the valence band offset for the InGaAsN/GaAs p-n heterojunction 10 is small, thereby allowing photogenerated holes (indicated in FIG. 2a as a circle with a cross inside) in the n-type InGaAsN layer 12 to be swept across an electric-field region (i.e. a depletion region) of the heterojunction 10 in the direction shown by the arrow with a nearly 100% theoretical quantum efficiency.

Figure 2B:
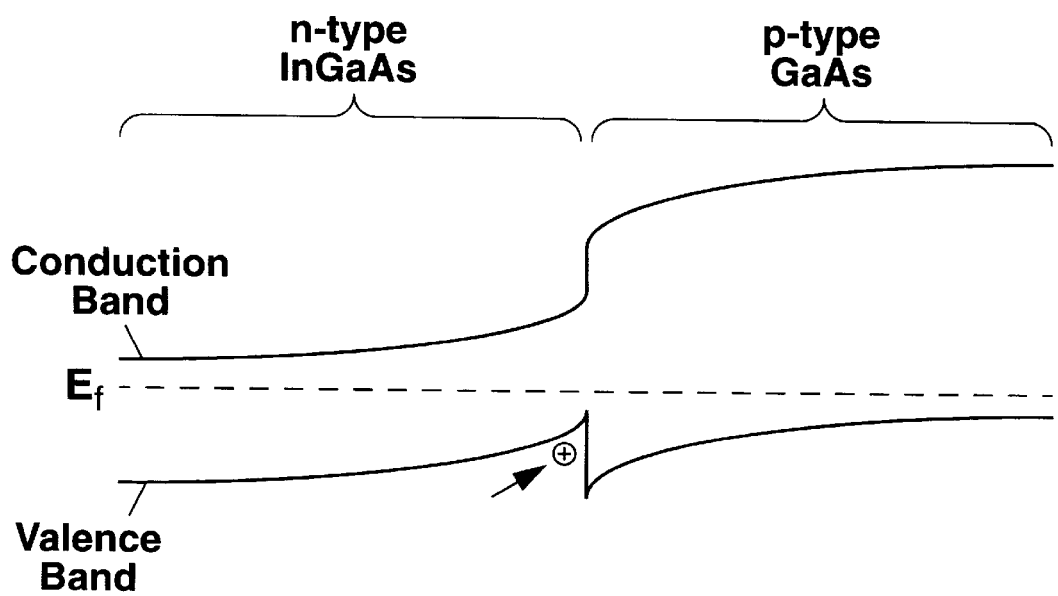
FIG. 2b shows an energy band diagram for an InGaAs/GaAs p-n heterojunction, indicating the occurrence of a sizeable valence band offset which is disadvantageous in limiting hole transport across the p-n heterojunction.

With III-V compound semiconductor materials other than InGaAsN and GaAs, there can be a sizeable valence band offset which can trap a portion of the photogenerated holes, thereby leading to a diminished quantum efficiency. This is the case, for example, for an InGaAs/GaAs heterojunction as shown in FIG. 2b which would be unsuitable for forming an efficient photodetector.

After the annealing step, a lower contact 22 (e.g. comprising Be/Au) can be formed over a portion or the entirety of the lower surface of the substrate 16 as shown in FIG. 1; and an upper contact 20 (e.g. comprising Pd/Ge/Au) can be formed and patterned as a grid electrode with one or more windows or openings 24 for transmission of incident light 100 to be detected.

To characterize the performance of the InGaAsN-GaAs p-n heterojunction 10, a short-circuit current, $I_{sc}$, and an open-circuit voltage, $V_{oc}$, can be measured between the contacts 20 and 22 in response to various intensity levels of incident light 100 from a light source or solar simulator. The light intensity can be varied, for example, by inserting a series of neutral density filters between the InGaAsN/GaAs p-n heterojunction 10 and the light source.

Figure 3:
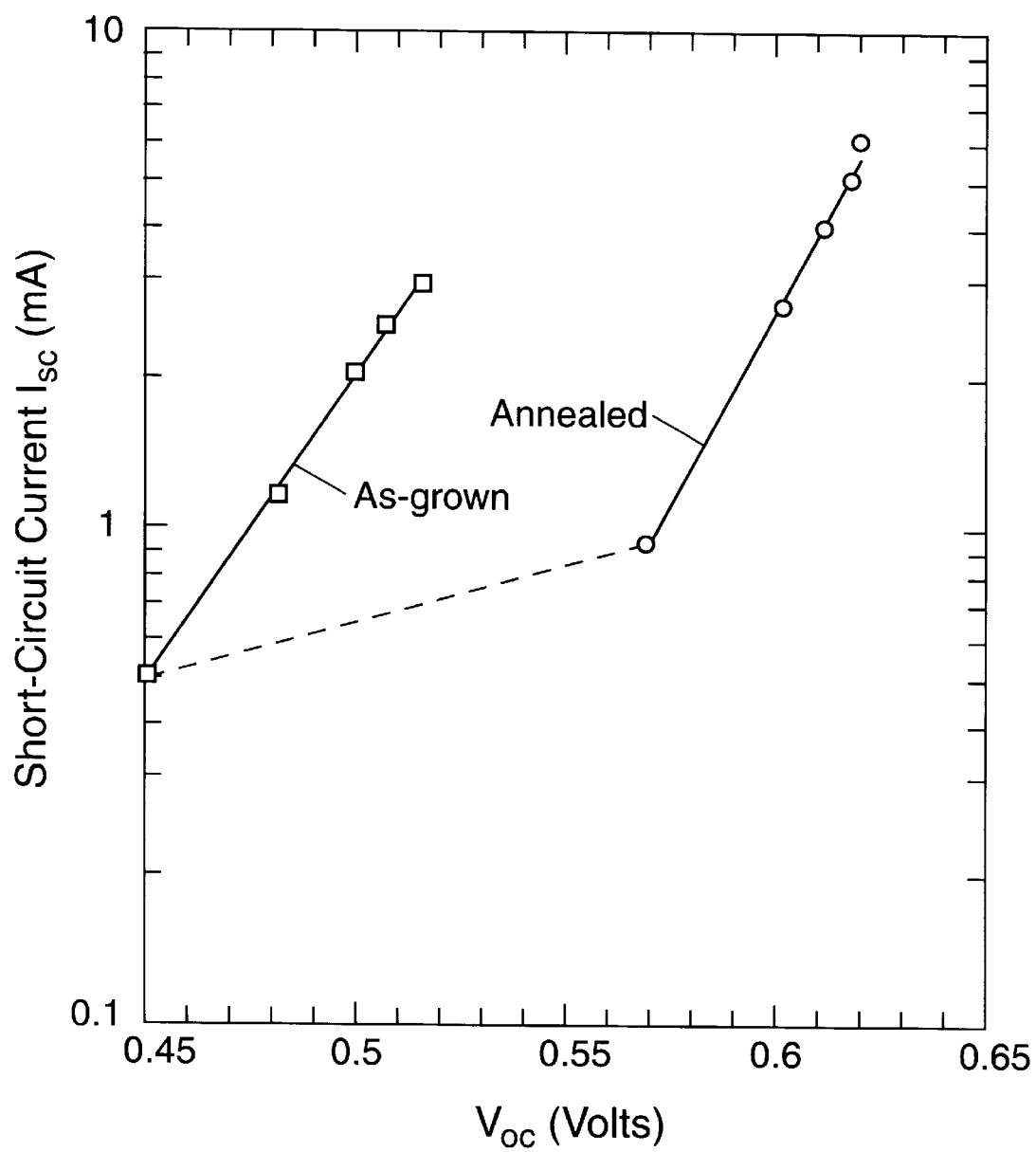
FIG. 3 shows curves on a logarithmic scale to show the short-circuit current, $I_{sc}$, and open-circuit voltage, $V_{oc}$, electrical characteristics for as-grown and annealed InGaAsN/GaAs p-n heterojunctions formed according to the present invention.

FIG. 3 shows the results of measurements of the short-circuit current, $I_{sc}$, and open-circuit voltage, $V_{oc}$, at different incident light levels for unannealed and annealed InGaAsN/GaAs p-n heterojunctions 10 formed according to the present. The InGaAsN/GaAs p-n heterojunctions 10 formed on a GaAs substrate 16 as shown in FIG. 1, had an active area of 0.2 cm$^2$ without any anti-reflection coating over the cap layer 18. These unannealed and annealed InGaAsN/GaAs p-n heterojunctions 10 were taken from the same MBE-grown GaAs substrate 16 to facilitate comparison.

In FIG. 3, the data points (indicated as open squares or circles) generated at various incident light levels are plotted on a logarithmic scale for fitting to a Shockley-type diode equation in which the short-circuit current, $I_{sc}$, and the open-circuit voltage, $V_{oc}$, are exponentially related. Exponential fits to the data are plotted in FIG. 3 as the straight solid lines. These fits to the data indicate a saturation current density $J_s=6.0\times10^{-9}$ A-cm$^{-2}$ and an ideality factor n=1.034 for the as-grown (i.e. unannealed) InGaAsN/GaAs p-n heterojunction 10; and values of $J_s=4.5\times10^{-12}$ A-cm$^{-2}$ and n=1.10 for the annealed heterojunction 10.

Annealing of the InGaAsN layer 12 in the heterojunction 10 as described heretofore improves both the open-circuit voltage, $V_{oc}$, and the short-circuit current, $I_{sc}$, at a particular level of the incident light 100 as shown by the dashed line in FIG. 3. At the highest measured incident light level in FIG. 3, the annealed InGaAsN/GaAs p-n heterojunction 10 had a measured open-circuit voltage of $V_{oc}=0.62$ Volts.

Figure 4:
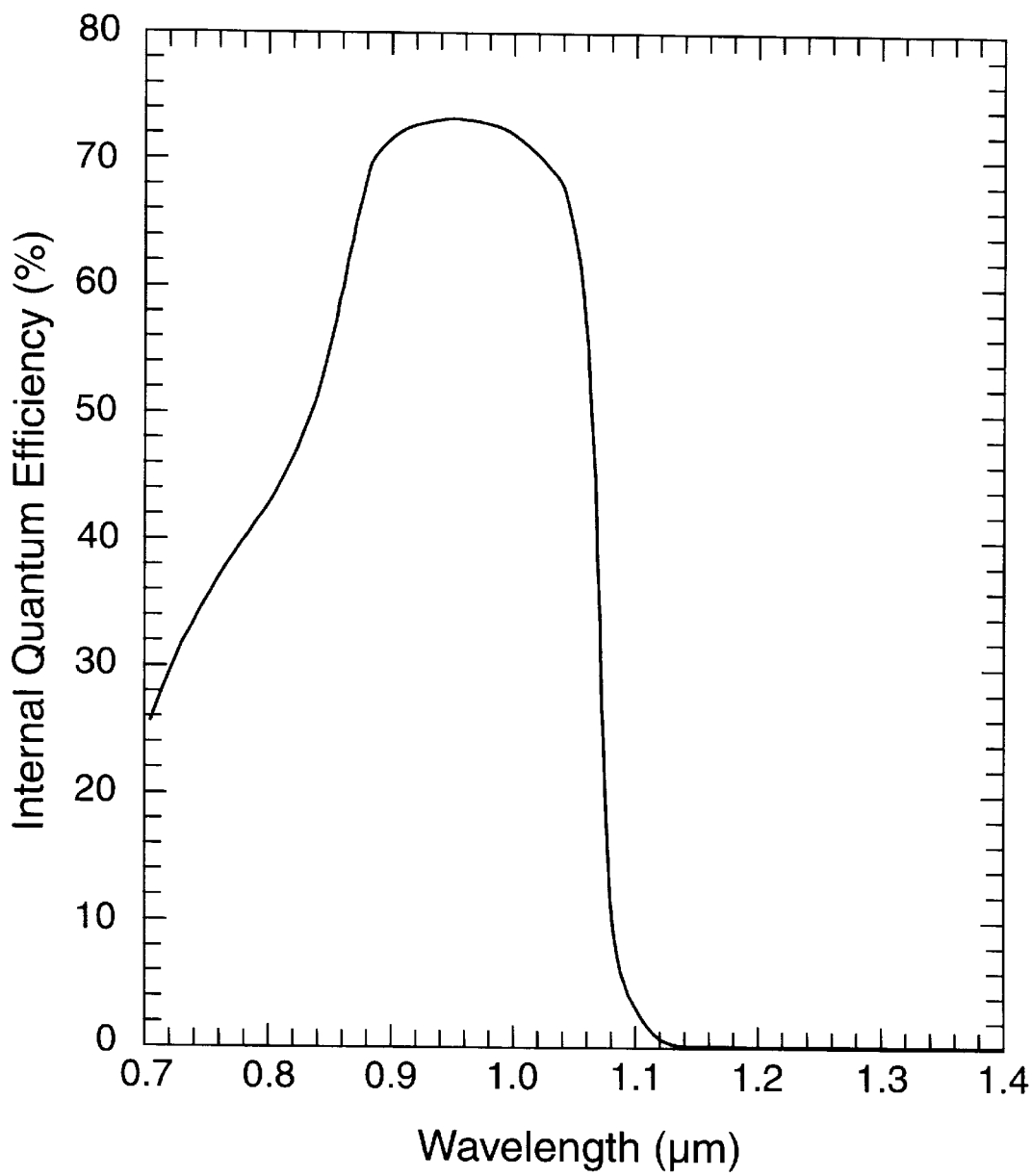
FIG. 4 shows the dependence of the internal quantum efficiency of the annealed InGaAsN/GaAs p-n heterojunction as a function of the wavelength of incident light.

FIG. 4 shows a curve of the internal quantum efficiency of the InGaAsN/GaAs p-n heterojunction 10 of the present invention as a function of the wavelength of the incident light 100 after annealing. Annealing of the n-type InGaAsN layer 12 of the heterojunction 10 is important for reducing the level of nitrogen-related "intrinsic" defects in the as-grown InGaAsN, thereby increasing the minority carrier (i.e. hole) diffusion length. Such annealing can be performed ex-situ as described previously (e.g. in a rapid thermal annealer), or in-situ after growth of the n-type InGaAsN layer 12 and an overlying semiconductor layer (e.g. a window layer or a tunnel junction) to cap the layer 12. The annealing step results in a substantial increase by a factor of 4–5 in the internal quantum efficiency of the InGaAsN/GaAs p-n heterojunction 10 to the level shown in FIG. 4. Further increases in the internal quantum efficiency of the InGaAsN/GaAs p-n heterojunction 10 can be achieved with an improvement in the quality of the n-type InGaAsN layer 12.

The energy bandgap, $E_{gap}$, of a semiconductor material such as the n-type InGaAsN layer 12 and a room-temperature absorption edge wavelength, $\lambda_0$, of that same semiconductor material are interrelated by the equation:

$$E_{gap}=1.2398/\lambda_0$$

with the incident light 100 being absorbed in the semiconductor material for wavelengths less than $\lambda_0$. Thus, an energy bandgap of 1.16 eV can be determined for the InGaAsN/GaAs p-n heterojunction 10 in FIG. 4 from the sharp increase in the internal quantum efficiency curve at 1.07 µm wavelength. At its peak, the internal quantum efficiency of the InGaAsN-GaAs p-n heterojunction 10 in FIG. 4 exceeds 70%. Finally, a drop in the internal quantum efficiency for wavelengths less than 0.88 µm occurs due to absorption of the incident light 100 by the overlying GaAs cap layer 18, thereby preventing a portion of the incident light 100 from reaching the underlying InGaAsN layer 12. When used in a multi-junction solar cell, other homojunctions overlying the InGaAsN/GaAs p-n heterojunction 10 would absorb the incident light at wavelengths ≧0.88 µm to generate electricity from this portion of the incident light 100 at high efficiency.

Figure 5:
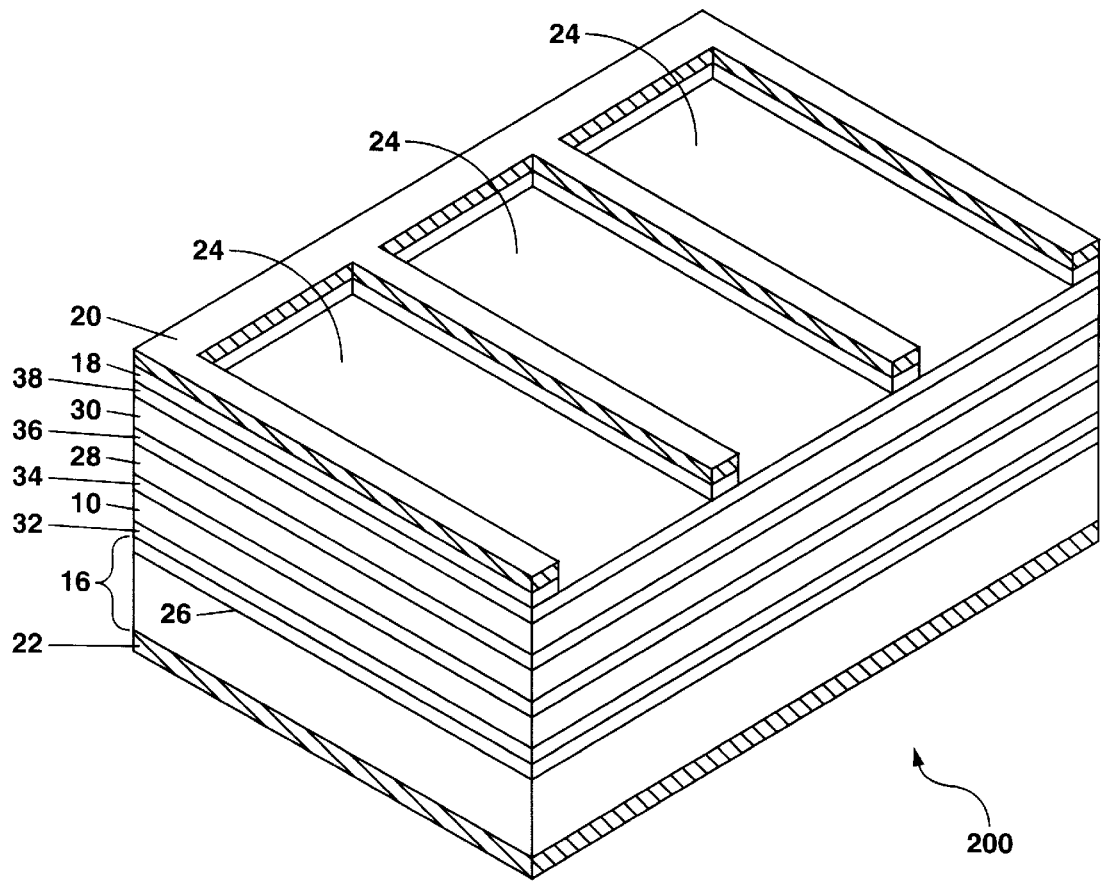
FIG. 5 shows a schematic perspective view of an example of a multi-junction solar cell incorporating the InGaAsN-GaAs p-n heterojunction of the present invention.

FIG. 5 shows an example of how the InGaAsN/GaAs p-n heterojunction 10 of the present invention can be incorporated into a multi-junction solar cell 200 for the efficient generation of electricity. In the example of FIG. 5, the solar cell 200 is a four-junction solar cell epitaxially grown on a p-type Ge substrate 16 which includes a first semiconductor p-n junction 26 which is a Ge p-n homojunction with a bandgap energy of 0.67 eV formed by either diffusing an n-type dopant (e.g. As) into the p-type Ge substrate 16, or alternately by epitaxially growing an n-type Ge layer over the substrate 16.

For use in the multi-junction solar cell 200 in FIG. 5, the InGaAsN/GaAs p-n heterojunction 10 of the present invention can be epitaxially grown above the Ge substrate 16 with an overall thickness of about 3 µm to form a second p-n junction. A third p-n junction 28 of the solar cell 200 can be formed by epitaxially growing a GaAs p-n homojunction with a bandgap energy of 1.42 eV above the InGaAsN/GaAs p-n heterojunction 10. A fourth p-n junction 30 can then be epitaxially grown above the third p-n junction 28, with the fourth p-n junction 30 comprising either an InGaP p-n homojunction with a bandgap energy of 1.85 eV, or alternately an InGaAlP p-n homojunction with a bandgap energy of 2.0 eV. Each of the homojunctions forming the third and fourth p-n junctions can be about 3 μm thick, with the exact layer thickness being used to provide a substantially equal short-circuit current, $I_{sc}$, between adjacent of the semiconductor p-n junctions of the series-connected solar cell 200.

In the example of FIG. 5, tunnel junctions are epitaxially grown between each adjacent pair of the p-n junctions forming the multi-junction solar cell 200. A tunnel junction is defined herein as a semiconductor junction that is sufficiently thin to provide for tunneling of carriers (i.e. electrons and holes) therethrough under reverse-bias conditions. The tunnel junctions are oriented with a polarity opposite that of the p-n junctions (i.e. each tunnel junction is formed with an n-side contacting the n-type doped layer of a particular p-n junction and a p-side contacting the p-type doped layer of an adjacent p-n junction).

In FIG. 5, a first tunnel junction 32 is used between the Ge substrate 16 containing the first p-n junction 26 and the InGaAsN/GaAs p-n heterojunction 10. The first tunnel junction 32, which can comprise either a GaAs tunnel junction, or an InGaAsN tunnel junction, is formed from a first-grown n-type layer (forming the n-side) and a second-grown p-type layer (forming the p-side), with each layer being about 10–20 nanometers thick and heavily doped to about $10^{19}$ cm$^{-3}$.

The InGaAsN/GaAs p-n heterojunction 10 can be formed as described previously for use in the multi-junction solar cell 200 of FIG. 5. For optimum efficiency, the semiconductor alloy composition of the n-type InGaAsN layer 12 of the heterojunction 10 can be selected to provide a predetermined band gap energy in a range from about 0.95–1.2 eV.

A second tunnel junction 34 is epitaxially grown above the InGaAsN/GaAs p-n heterojunction 10 in the example of FIG. 5. The second tunnel junction 34 can comprise GaAs and can be formed similarly to the first tunnel junction 32.

In FIG. 5, the third p-n junction 28 preferably comprises a GaAs p-n homojunction with a bandgap energy of 1.42 eV. A majority of the typically 3 μm thickness of the third p-n junction can be n-type doped (e.g. to about $10^{17}$ cm$^{-3}$), with the remainder being p-type doped (e.g. to about $3 \times 10^{18}$ cm$^{-3}$).

A third tunnel junction 36 is epitaxially grown above the GaAs third p-n junction 28 in the example of the multi-junction solar cell 200 in FIG. 5. The third tunnel junction 36 can be formed, for example, as an AlGaAs homojunction (e.g. $Al_{0.35}Ga_{0.65}As$), or alternately as a heterojunction formed by 10–20-nm-thick layers of AlGaAs (e.g. $Al_{0.35}Ga_{0.65}As$) and InGaP (e.g. $In_{0.49}Ga_{0.51}P$), with the AlGaAs layer being n-type doped to about $6 \times 10^{18}$ cm$^{-3}$ and located directly over the GaAs third p-n junction 28, and with the InGaP layer being p-type doped to about $10^{19}$ cm$^{-3}$. Trimethylaluminum (TMAl) and phosphine ($PH_3$) can be used as source gases when growing the third tunnel junction by MOCVD.

A fourth p-n junction 30 is grown above the third tunnel junction 36. The fourth p-n junction can comprise an InGaP (e.g. $In_{0.5}Ga_{0.5}P$) p-n homojunction, or alternately an InGaAlP (e.g. $In_{0.5}Ga_{0.45}Al_{0.05}P$) p-n homojunction. The use of an InGaAlP p-n homojunction can be advantageous for providing a slightly higher bandgap energy of 2.0 eV to provide a slight increase in the overall energy conversion efficiency of the multi-junction solar cell 200 than can be obtained using an InGaP p-n homojunction.

In FIG. 5, a window layer 38 is epitaxially grown over the fourth p-n junction 30. The window layer 38 can comprise about 30 μm of InAlP (e.g. $In_{0.5}Al_{0.5}P$) with a bandgap energy of about 2.5 eV for transparency to solar illumination. The InAlP window layer 38 can be heavily n-type doped (e.g. about $5 \times 10^{18}$–$10^{19}$ cm$^{-3}$). A GaAs cap layer 18 can then be epitaxially grown over the window layer 38 for use in electrically contacting the solar cell 200. The GaAs cap layer 18 can be about 30 μm thick and n-type doped to about $10^{19}$ cm$^{-3}$ or more.

Although not shown in FIG. 5, each semiconductor p-n junction can further include a back-surface field (BSF) layer to assist in retaining photogenerated carriers (i.e. electrons and holes) within the junction, and to prevent migration of the carriers to an adjacent tunnel junction.

After epitaxial growth, the cap layer 18 can be patterned by etching to provide one or more windows or openings 24 therethrough as shown in FIG. 5. Patterning of the GaAs cap layer 18 to form the openings 24 eliminates absorption of a portion of the incident light 100 which would otherwise occur in the cap layer 18.

A full-surface lower electrical contact 22 (e.g comprising Be/Au) can then be formed on a lower surface of the p-type Ge substrate 16; and a patterned upper electrical contact 20 (e.g comprising Au/Ge/Ni or Pd/Ge/Au) can also be formed as shown in FIG. 5. The upper electrical contact 20, which is patterned to conform to the etched shape of the patterned cap layer 28, can comprise a comb or grid structure to convey the photogenerated electrical current out of the solar cell 200 while providing a large fill factor for efficient operation. Other arrangements for the upper contact 20 are possible, depending upon a particular size or application of the solar cell 200 to be formed, including whether a the solar cell 200 is designed for use with a solar concentrator.

An anti-reflection (AR) coating (e.g. comprising one or more pairs of alternating layers of $SiO_2$ and $TiO_2$) can optionally be provided over the exposed window layer 38 to minimize a reflection loss of the incident light 100 to further increase the energy conversion efficiency of the multi-junction solar cell 200. The completed device 200 of FIG. 5 can to convert sunlight into electrical energy with a theoretical energy conversion efficiency of about 40%.

Other embodiments of a multi-junction solar cell using the InGaAsN/GaAs p-n heterojunction of the present invention are possible. For example, the first junction 26 in the Ge substrate 16 and the overlying first tunnel junction 32 can be omitted to form a three-junction solar cell having a reduced energy conversion efficiency. Alternately, a three-junction solar cell can be formed by substituting a GaAs substrate for the Ge substrate 16 in FIG. 5 and omitting the first tunnel junction 32. Finally, a three- or four-junction solar cell can be formed on an n-type GaAs or Ge substrate 16 by reversing the polarities of each of the p-n junctions, tunnel junctions and BSF layers.

The matter set forth in the foregoing description and accompanying drawings is offered by way of illustration only and not as a limitation. Other applications and variations of the InGaAsN/GaAs semiconductor p-n heterojunction and method for fabrication thereof will become evident to those skilled in the art. For example, the InGaAsN/GaAs semiconductor p-n heterojunction of the present invention can be used as a 0.95–1.2 eV bandgap photodetector (e.g. by forming a device as shown in FIG. 1) for the detection of incident light at wavelengths below 1–1.3 μm. The actual scope of the invention is intended to be defined in the following claims when viewed in their proper perspective based on the prior art.

What is claimed is:

1. A semiconductor p-n heterojunction for use in a multi-junction solar cell, comprising a layer of indium gallium arsenide nitride (InGaAsN) with n-type doping, at least in part, in contact with a layer of gallium arsenide (GaAs) with p-type doping.

2. The semiconductor p-n heterojunction of claim 1 wherein the InGaAsN and GaAs layers are epitaxially grown on a semiconductor substrate.

3. The semiconductor p-n heterojunction of claim 2 wherein the substrate comprises GaAs.

4. The semiconductor p-n heterojunction of claim 2 wherein the substrate comprises germanium (Ge).

5. The semiconductor p-n heterojunction of claim 2 wherein the substrate is n-type doped or p-type doped.

6. The semiconductor p-n heterojunction of claim 1 wherein the InGaAsN layer has a semiconductor alloy composition $In_xGa_{1-x}As_{1-y}N_y$ with $0<x\leq0.2$ and with $0<y\leq0.04$.

7. The semiconductor p-n heterojunction of claim 6 wherein the semiconductor alloy composition $In_xGa_{1-x}As_{1-y}N_y$ is selected to provide a lattice constant of the InGaAsN layer that is substantially equal to the lattice constant of the substrate.

8. The semiconductor p-n heterojunction of claim 1 wherein the InGaAsN layer is n-type doped with an n-type dopant selected from the group consisting of silicon, selenium, sulphur, germanium and tin.

9. The semiconductor p-n heterojunction of claim 1 wherein a first portion of the InGaAsN layer is n-type doped to less than $10^{17}$ cm$^{-3}$, and a second portion of the InGaAsN layer is n-type doped to $10^{17}$–$10^{18}$ cm$^{-3}$.

10. The semiconductor p-n heterojunction of claim 1 wherein the InGaAsN layer has a semiconductor alloy composition to provide a bandgap energy in the range of 0.95 to 1.2 electron volts (eV).

11. The semiconductor p-n heterojunction of claim 1 wherein the InGaAsN layer has a layer thickness in the range of 1 to 5 microns.

12. The semiconductor p-n heterojunction of claim 1 wherein the GaAs layer is p-type doped with a p-type dopant selected from the group consisting of beryllium, carbon, zinc, cadmium and magnesium.

13. A photodetector comprising:

(a) a semiconductor p-n heterojunction formed from a layer of indium gallium arsenide nitride (InGaAsN) with, at least in part, n-type doping in contact with a layer of gallium arsenide (GaAs) with p-type doping; and (b) electrical contacts formed above and below the semiconductor p-n heterojunction.

14. The photodetector of claim 13 wherein the InGaAsN and GaAs layers are epitaxially grown on a semiconductor substrate.

15. The photodetector of claim 14 wherein the substrate comprises GaAs.

16. The photodetector of claim 14 wherein the substrate comprises germanium (Ge).

17. The photodetector of claim 14 wherein the substrate is n-type doped or p-type doped.

18. The photodetector of claim 13 wherein the InGaAsN layer has a semiconductor alloy composition $In_xGa_{1-x}As_{1-y}N_y$ with $0<x\leq0.2$ and with $0<y\leq0.04$.

19. The photodetector of claim 18 wherein the semiconductor alloy composition $In_xGa_{1-x}As_{1-y}N_y$ is selected to provide a lattice constant of the InGaAsN layer that is substantially equal to the lattice constant of the substrate.

20. The photodetector of claim 13 wherein the InGaAsN layer is n-type doped with an n-type dopant selected from the group consisting of silicon, selenium, sulphur, germanium and tin.

21. The photodetector of claim 13 wherein a first portion of the InGaAsN layer is n-type doped to less than $10^{17}$ cm$^{-3}$, and a second portion of the InGaAsN layer is n-type doped to $10^{17}$–$10^{18}$ cm$^{-3}$.

22. The photodetector of claim 13 wherein the InGaAsN layer has a semiconductor alloy composition to provide a bandgap energy in the range of 0.95 to 1.2 electron volts (eV).

23. The photodetector of claim 13 wherein the InGaAsN layer has a layer thickness in the range of 1 to 5 microns.

24. The photodetector of claim 13 wherein the GaAs layer is p-type doped with a p-type dopant selected from the group consisting of beryllium, carbon, zinc, cadmium and magnesium.

* * * * *